(12) United States Patent
Yutani et al.

(10) Patent No.: US 8,207,528 B2
(45) Date of Patent: Jun. 26, 2012

(54) ORGANIC TRANSISTOR, ORGANIC TRANSISTOR ARRAY, AND DISPLAY DEVICE

(75) Inventors: Keiichiro Yutani, Kanagawa (JP); Hidenori Tomono, Kanagawa (JP); Takumi Yamaga, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 210 days.

(21) Appl. No.: 12/670,325

(22) PCT Filed: Oct. 17, 2008

(86) PCT No.: PCT/JP2008/069293
§ 371 (c)(1),
(2), (4) Date: Jan. 22, 2010

(87) PCT Pub. No.: WO2009/057514
PCT Pub. Date: May 7, 2009

(65) Prior Publication Data
US 2010/0193775 A1 Aug. 5, 2010

(30) Foreign Application Priority Data
Oct. 29, 2007 (JP) ................................. 2007-280699

(51) Int. Cl.
*H01L 35/24* (2006.01)
(52) U.S. Cl. .................... 257/40; 257/66; 257/E51.005; 257/E51.006; 257/E51.018
(58) Field of Classification Search .................... 257/40, 257/66, E51.005, E51.006, E51.018
See application file for complete search history.

(56) References Cited

U.S. PATENT DOCUMENTS

2007/0085076 A1* 4/2007 Yamamoto et al. ............. 257/40

FOREIGN PATENT DOCUMENTS

| GB | 2391385 A | 2/2004 |
|---|---|---|
| JP | 2002-540591 | 11/2002 |
| JP | 2003-536260 | 12/2003 |
| JP | 2004-141856 | 5/2004 |
| JP | 2004-297011 | 10/2004 |
| JP | 2005-79560 | 3/2005 |
| JP | 2005-310962 | 11/2005 |
| JP | 2006-332474 | 12/2006 |
| JP | 2007-36006 | 2/2007 |
| JP | 2008-205262 | 9/2008 |
| WO | WO00/36666 A1 | 2/2000 |
| WO | WO01/95384 A1 | 12/2001 |

* cited by examiner

*Primary Examiner* — Long Pham
(74) *Attorney, Agent, or Firm* — Cooper & Dunham LLP

(57) ABSTRACT

An organic transistor includes a substrate; a gate electrode and a gate insulating film sequentially formed on the substrate in the stated order; and a source electrode, a drain electrode, and an organic semiconductor layer formed on at least the gate insulating film. Ultraviolet light is radiated to the substrate from a side without the gate electrode, transmitted through the substrate and the gate insulating film, reflected at the gate electrode, and absorbed at the organic semiconductor layer. Conductivity of the organic semiconductor layer that has absorbed the ultraviolet light is lower than that of the organic semiconductor layer that has not absorbed the ultraviolet light.

13 Claims, 13 Drawing Sheets

ORGANIC TRANSISTOR, ORGANIC TRANSISTOR ARRAY, AND DISPLAY DEVICE

TECHNICAL FIELD

The present invention relates to an organic transistor, an organic transistor array, and a display device.

BACKGROUND ART

Active research is being conducted for organic thin-film transistors (TFTs), as they have the following advantages.
1. High flexibility in terms of the variety in the materials, manufacturing method, and product format.
2. The area can be easily increased.
3. The layer structure can be simplified, and the manufacturing process can be simplified.
4. A low-cost manufacturing device can be used for the manufacturing process.

Examples of the film forming method of the organic semiconductor layer are a printing method, a spin-coating method, and a dipping method. An organic TFT can be manufactured at a considerably lower cost compared to a conventional TFT using a Si semiconductor material.

When integrating an organic TFT, it is necessary to form an electrode pattern. Patent document 1 discloses a method of manufacturing a laminated structure, including a step of forming a wettability varying layer including a material whose critical surface tension is changed by receiving energy; a step of forming a pattern with portions of different critical surface tensions including a low surface energy portion having a low critical surface tension that is formed by applying energy to a part of the wettability varying layer and a high surface energy portion having higher critical surface tension; a step of forming a conductive layer in the high surface energy portion by applying a liquid including a conductive material on the surface of the wettability varying layer on which the pattern is formed; and a step of forming a semiconductor layer on the wettability varying layer.

Furthermore, when fabricating an organic TFT, it is necessary to form a pattern of the organic semiconductor layer. If the organic TFT is integrated without forming a pattern of the organic semiconductor layer, the following problem may occur. That is, due to the impact of the organic semiconductor layer formed on portions other than the channel region, an off current may be generated while the transistor is operating, in which case power consumption will increase. Furthermore, this may cause crosstalk when displaying pixels. When fabricating a TFT using the Si semiconductor material, a pattern is formed with the Si semiconductor material by photolithography etching.

When consideration is made only for forming a pattern of the organic semiconductor layer, a photoresist is applied, a desired pattern is formed by a light exposure process and a developing process, thereby forming a resist pattern. This is used as an etching mask to perform etching. Then, the resist is peeled off, thereby forming the pattern. However, when a high polymer material is used as the organic semiconductor material, and a pattern is formed by applying a photoresist on the high polymer material, the transistor properties may be degraded. A photoresist is obtained by dissolving a novolac resin using naphthoquinone diazide as the photosensitive group in an organic solvent such as a xylene solvent and a cellosolve solvent. The high polymer material is often dissolved in an organic solvent included in the photoresist. When a crystalline molecule such as pentacene is used as the organic semiconductor material, the transistor properties may be similarly degraded to some degree or another. Furthermore, damage may be caused by using a peeling agent such as ethylene glycol monobutyl ether and monoethanolamine when peeling off the resist. Damage may be caused by rinsing the organic semiconductor layer with pure water after peeling off the resist. Due to the above reasons, it is difficult to form a pattern of the organic semiconductor layer by the conventional photolithography etching method.

Patent document 2 discloses a method of manufacturing a transistor, including a step of providing a conductive layer on a substrate; a step of providing a mask having at least one window on the conductive layer; a step of etching the conductive layer through the window to form an opening in the conductive layer, and setting part of the conductive layer to form the source and the drain of the transistor; a step of depositing the conductive material through the window and forming a metal transistor gate in the opening; a step of forming a dielectric layer made of a metallic oxide on the gate; and a step of putting a semiconductor material in between the source and the drain, on the gate, and in a space between the source or the drain and the gate, to thereby form the semiconductor body of the transistor. The etching is performed in such a manner as to cause undercutting at the periphery of the window, so that the opening is wider than the window in the direction parallel to the surface of the substrate. The conductive material is deposited by metal evaporation in such a manner that the periphery of the gate is spaced away from the source and the drain, and that the periphery of the gate of the transistor perfectly overlaps the periphery of the opening.

Patent document 3 discloses a method of fabricating an organic transistor by appropriately combining the following methods. One method is for applying charges to a predetermined position of surface to be coated as well as applying charges of a polarity opposite to that of the aforementioned charges to a coating material to attract the material applied with charges to a predetermined position with a Coulomb force. Another method is for forming a recessed part at the predetermined position of the surface to be coated to deposit the coating material on the recessed part. Yet another method is evaporating the solvent after applying the coating material to form the pattern, and then radiating a laser beam to the pattern.

However, the problem with these processes is that as the number of process steps increases, the throughput will decrease and the manufacturing cost will increase.

Patent document 4 discloses a thin film transistor including a gate electrode formed on a substrate; a gate insulating film formed on the gate electrode; a source electrode formed on the gate insulating film; a drain electrode formed on the gate insulating film; a semiconductor film made with an aggregate of organic semiconductor molecules, whereby the semiconductor film is formed on the gate insulating film, the source electrode, and the drain electrode; and a self-assembled monolayer formed inside the gate electrode projection region and at the interface between the gate insulating film and the semiconductor film. Furthermore, light is radiated onto the self-assembled monolayer formed on the surface of the insulating film, from the backside of the substrate with the gate electrode acting as a photomask, to remove the self-assembled monolayer from the region in which a semiconductor film is formed, other than the gate electrode projection region.

However, with this method, the organic semiconductor material is limited, and therefore the freedom in selecting the material is low.

Meanwhile, when a high polymer material that is soluble in an organic solvent is used as the organic semiconductor material, the pattern can be formed by the inkjet method. With the inkjet method, the pattern can be directly rendered, and therefore the material usage rate can be considerably enhanced. Furthermore, by performing the inkjet method to form a pattern, the manufacturing process may be simplified, the yield may be increased, and the cost may be decreased.

However, when forming a pattern on a large area, it is difficult to perfectly form a pattern for all transistors, due to factors such as the precision in points of impact. Particularly, physical properties of the organic semiconductor ink, such as viscosity, surface tension, and drying conditions change considerably due to the purity of the high polymer material, the amount of molecules, the molecule amount distribution, and the solvent. Thus, it is difficult to adjust the physical properties to appropriate levels. For this reason, ink cannot always be jetted properly from all of the nozzles. In some cases, the jetted ink from one of the nozzles may be deflected, or the amount of jetted ink may vary. The same applies to head properties, and the nozzles will not always have the same properties. When the jetted ink from one of the nozzles is even slightly deflected, a pattern may be formed properly at low resolution but not at high resolution. As a result, the organic semiconductor layer may be a partially incomplete pattern. Such a problem is particularly notable when forming patterns on a large area.

Patent Document 1: Japanese Laid-Open Patent Application No. 2005-310962

Patent Document 2: Japanese Patent Application Publication No. 2003-536260

Patent Document 3: Japanese Laid-Open Patent Application No. 2004-297011

Patent Document 4: Japanese Laid-Open Patent Application No. 2005-79560

Accordingly, there is a need for an organic transistor capable of decreasing the off current while the transistor is operating, an organic transistor array including a plurality of such organic transistors, and a display device including the organic transistor array.

DISCLOSURE OF THE INVENTION

The present invention may solve one or more problems of the related art.

According to an aspect of the present invention, there is provided an organic transistor that includes a substrate; a gate electrode and a gate insulating film sequentially formed on the substrate in the stated order; and a source electrode, a drain electrode, and an organic semiconductor layer formed on at least the gate insulating film. Ultraviolet light is radiated to the substrate from a side without the gate electrode, transmitted through the substrate and the gate insulating film, reflected at the gate electrode, and absorbed at the organic semiconductor layer. Conductivity of the organic semiconductor layer that has absorbed the ultraviolet light is lower than that of the organic semiconductor layer that has not absorbed the ultraviolet light.

According to one embodiment of the present invention, there are provided an organic transistor capable of decreasing the off current while the transistor is operating, an organic transistor array including a plurality of such organic transistors, and a display device including the organic transistor array.

BEST MODE FOR CARRYING OUT THE INVENTION

A description is given, with reference to the accompanying drawings, of an embodiment of the present invention.

Figure 1:
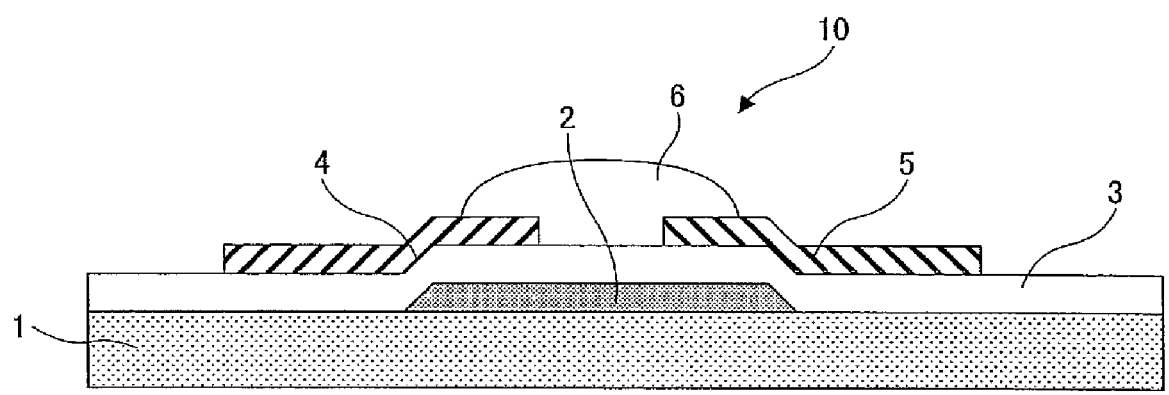
FIG. 1 is a cross-sectional view of an example of an organic transistor according to an embodiment of the present invention.

FIG. 1 illustrates an example of an organic transistor according to an embodiment of the present invention. An organic transistor 10 includes a gate electrode 2 and a gate insulating film 3 sequentially formed on a substrate 1 in this order, and a source electrode 4, a drain electrode 5, and an organic semiconductor layer 6 sequentially formed on the gate insulating film 3 in this order. Furthermore, the organic transistor 10 is irradiated with ultraviolet light from the side of the substrate 1 that does not have the gate electrode 2 formed thereon (hereinafter, "backside"), which ultraviolet light is transmitted through the substrate 1 and the gate insulating film 3, reflected from the gate electrode 2, the source electrode 4, and the drain electrode 5, and absorbed by the organic semiconductor layer 6. Thus, the ultraviolet light is absorbed by the organic semiconductor layer 6 at portions other than the projection regions of the gate electrode 2, the source electrode 4, and the drain electrode 5. As a result, the organic semiconductor layer 6 that has absorbed the ultraviolet light is decomposed, thereby having a lower conductivity than the organic semiconductor layer 6 that has not absorbed the ultraviolet light. Accordingly, the off current while the transistor is operating can be decreased. The projection region of an electrode corresponds to a region from which the ultraviolet light is reflected by the electrode when the ultraviolet light is radiated from the backside of the substrate 1.

In the organic transistor 10, electrodes for transmitting the radiated ultraviolet light can be formed of the source electrode 4 and the drain electrode 5. Furthermore, in the organic transistor 10, instead of sequentially forming the source electrode 4, the drain electrode 5, and the organic semiconductor layer 6 on the gate insulating film 3 in this order, they can be formed in the order of the organic semiconductor layer 6, the source electrode 4, and the drain electrode 5. In this case, the ultraviolet light will be absorbed by the organic semiconductor layer 6 at portions other than the projection region of the gate electrode 2.

The substrate 1 and the gate insulating film 3 preferably transmit the radiated ultraviolet light but do not absorb the ultraviolet light. Accordingly, it is possible to mitigate the amount of the ultraviolet light not radiated to the organic semiconductor layer 6 other than at the projection region of the gate electrode 2. Examples of the substrate 1 are a glass substrate and a film substrate, although these are not limiting. Examples of materials forming the film substrate are polyimide, polyethylene naphthalate, polyether sulfone, and polyethylene terephthalate. Examples of materials forming the gate insulating film 3 are acrylic resin such as polyimide, polyparaxylene, polyvinyl phenol, polyester, polyacrylonitrile, and polymethylmethacrylate; epoxy resin; and thermosetting resin, although the materials are not limited thereto.

The gate electrode 2 preferably reflects the radiated ultraviolet light but does not absorb the ultraviolet light. Accordingly, it is possible to prevent the ultraviolet light from being radiated to the organic semiconductor layer 6 at the projection region of the gate electrode 2.

The patterns of the source electrode 4 and the drain electrode 5, and/or the pattern of the gate electrode 2, can be formed by a printing method such as the inkjet method and the dispenser method. Metal ink including metal particles or a metal complex is preferably used. Examples of the metal particles are Au, Ag, Cu, Pt, Pd, Ni, Ir, Rh, Co, Fe, Mn, Cr, Zn, Mo, W, Ru, In, and Sn, although the metal particles are not limited thereto. Two or more of these kinds of metal particles can be used in combination. In particular, Au, Ag, Cu, and Ni are preferable in terms of electrical resistance, thermal conductivity, and corrosion resistance. It is known that the metal particles can be sintered at a significantly lower temperature when they have an average particle diameter of approximately several nm through several tens nm and are uniformly dispersed in a solvent. This is because as the particle diameters of the metal particles decrease, the impact of highly active surface atoms increases. A complex having Au, Pt, Ag, Cu, Pd, In, Cr, or Ni as the central metal can be used as the metal complex, although they are not limited thereto. Such metal ink is used to form a pattern, and the pattern is sintered, thereby forming the gate electrode 2, the source electrode 4, or the drain electrode 5.

When the metal ink does not have appropriate levels of surface tension and viscosity, the ink may not be jetted or jetting failures may occur. As a result, circular liquid drops may not be achieved, and the ligament may increase. Thus, the metal ink preferably has surface tension of approximately 30 mN/m, and viscosity of 2 mPa/s through 13 mPa/s, more preferably 7 mPa/s through 10 mPa/s. Furthermore, the metal ink needs to have drying properties so that it dries after being jetted, but not to the extent that the solvent evaporates and the metal particles or the metal complex solidifies.

The pattern of the organic semiconductor layer 6 is preferably formed by a printing method such as the inkjet method, the dispenser method, or the microcontact method. Organic semiconductor ink made by dissolving an organic semiconductor material in an organic solvent is preferably used to form the pattern of the organic semiconductor layer 6. Examples of organic semiconductor material that is soluble in an organic solvent are a high polymer material, an oligomer material, and a low polymer material, although the material is not limited thereto. Specific examples are polyphenylene conductive polymer such as polyacetylene conductive polymer, polyparaphenylene and derivatives thereof, and polyphenylenevinylene and derivatives thereof; heterocyclic conductive polymer such as polypyrrole and derivatives thereof, polythiophene and derivatives thereof, and polyfuran and derivatives thereof; and ionic conductive polymer such as polyaniline and derivatives thereof. In particular, a high polymer material having a triarylamine skeleton is preferable. A material expressed by chemical formula (A) can be used as such a high polymer material, although the material is not particularly limited thereto.

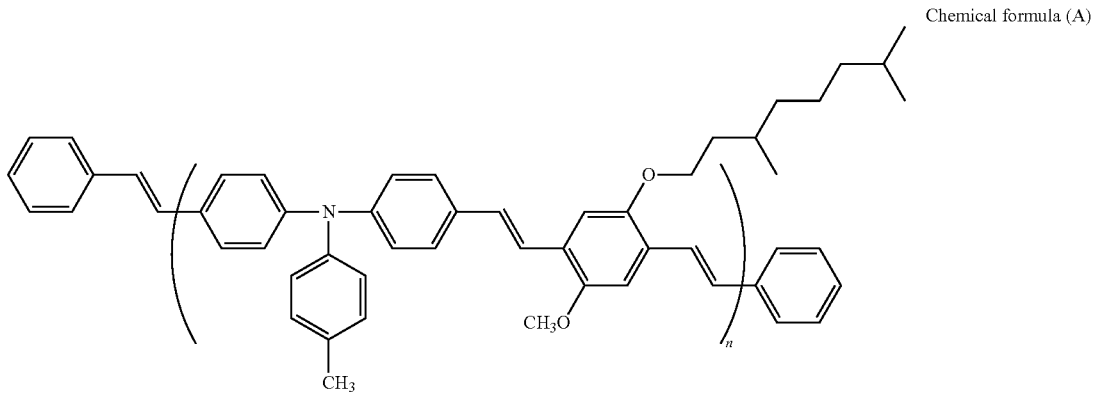

Chemical formula (A)

This material is a nonorientational high polymer material, which has extremely small variations in terms of its properties, regardless of the shape of the film or the film forming method.

Figure 2:
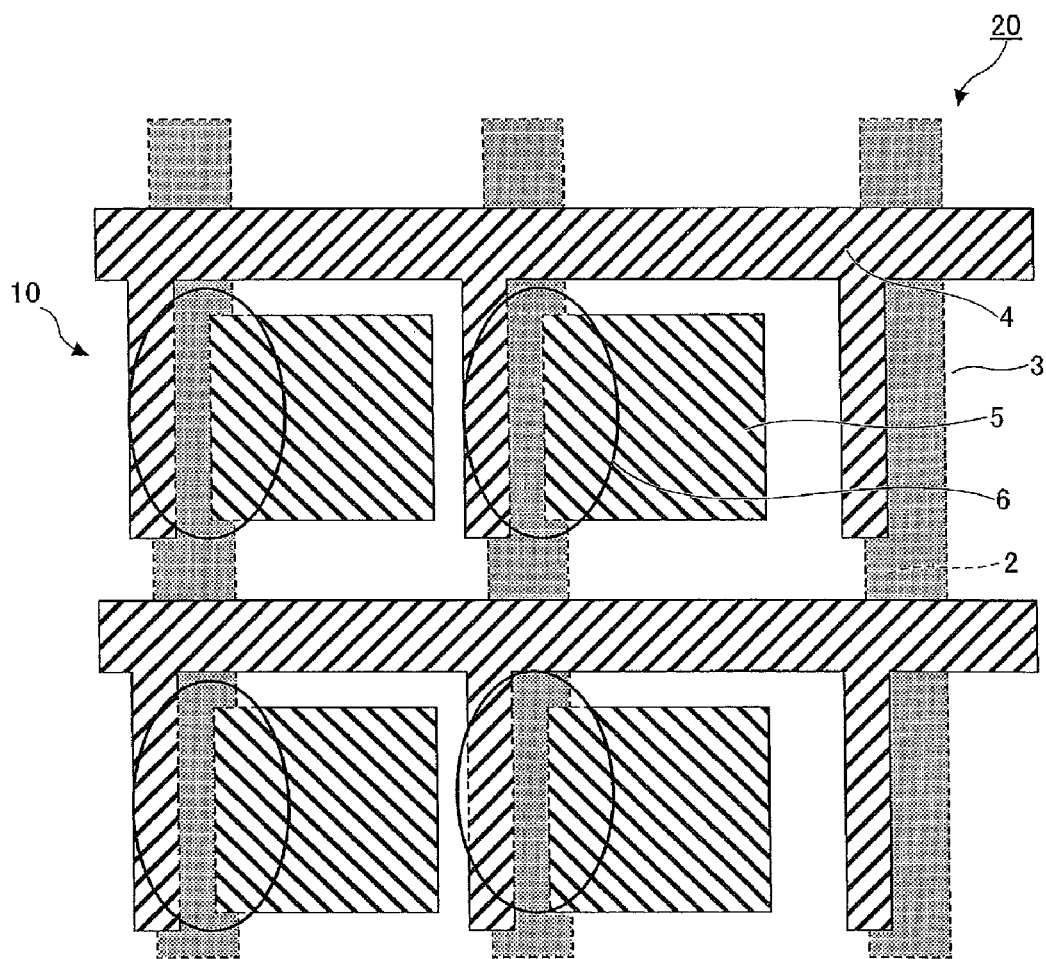
FIG. 2 is a top view of a first example of an organic transistor array according to an embodiment of the present invention.

FIG. 2 illustrates a first example of an organic transistor array according to an embodiment of the present invention. An organic transistor array 20 includes plural organic transistors 10. Each of the organic semiconductor layers 6 is formed as an isolated island-like shape for the corresponding organic transistor 10 by a printing method. Ultraviolet rays are radiated from the backside of the substrate (not shown), and ultraviolet light is absorbed in the organic semiconductor layer 6 in a region between the source electrode 4 and the drain electrode 5, at a portion other than the projection region of the gate electrode 2.

Figure 3:
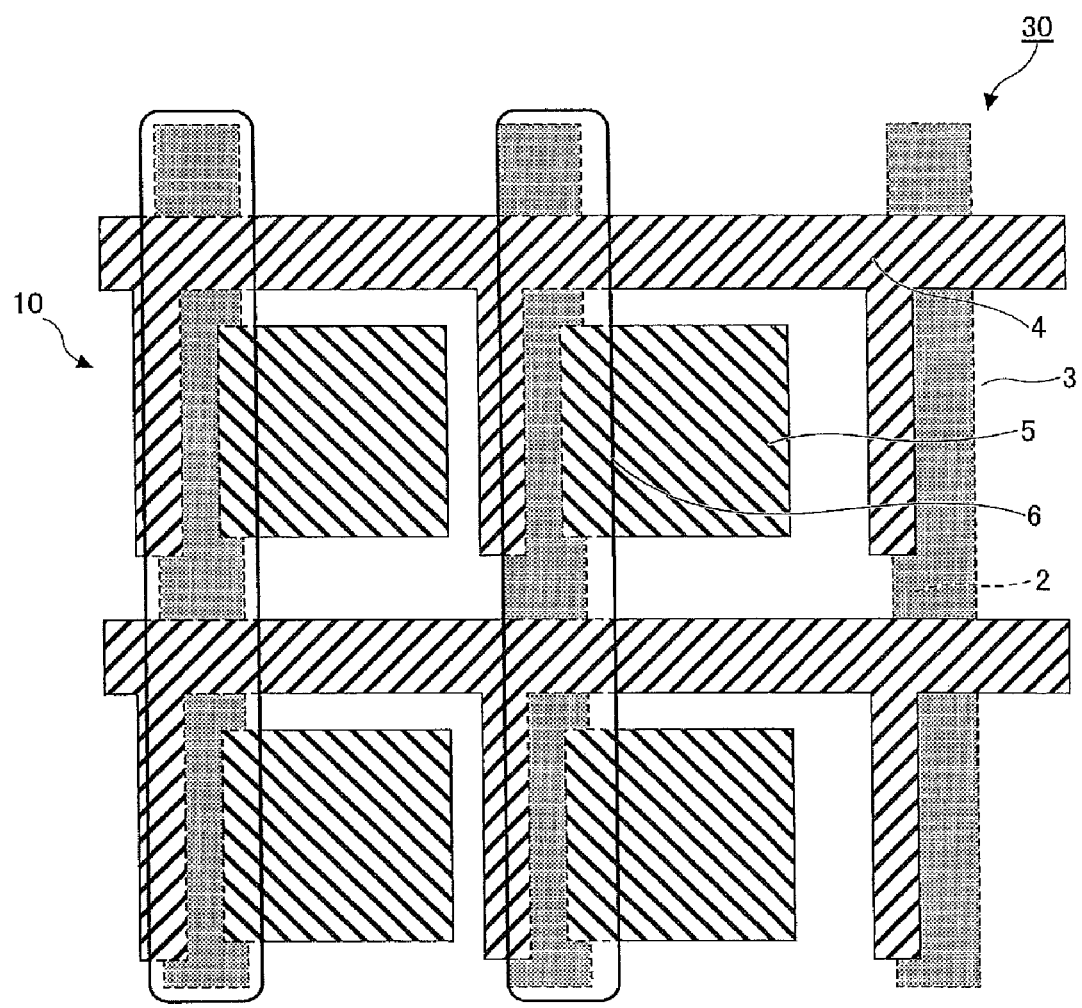
FIG. 3 is a top view of a second example of the organic transistor array according to an embodiment of the present invention.

FIG. 3 illustrates a second example of an organic transistor array according to an embodiment of the present invention. An organic transistor array 30 includes plural organic transistors 10. The organic semiconductor layers 6 of the organic transistors 10 are formed as stripes in the vertical direction as viewed in FIG. 3 by a printing method. Accordingly, patterns of the organic semiconductor layers 6 formed by the printing method can be applied at even higher resolution, and the throughput can also be increased. Furthermore, the alignment precision only needs to be adjusted in one direction, and therefore yield can be increased. Ultraviolet rays are radiated from the backside of the substrate (not shown), and ultraviolet light is absorbed in the organic semiconductor layer 6 in a region between the source electrode 4 and the drain electrode 5, at a portion other than the projection region of the gate electrode 2.

Figure 4:
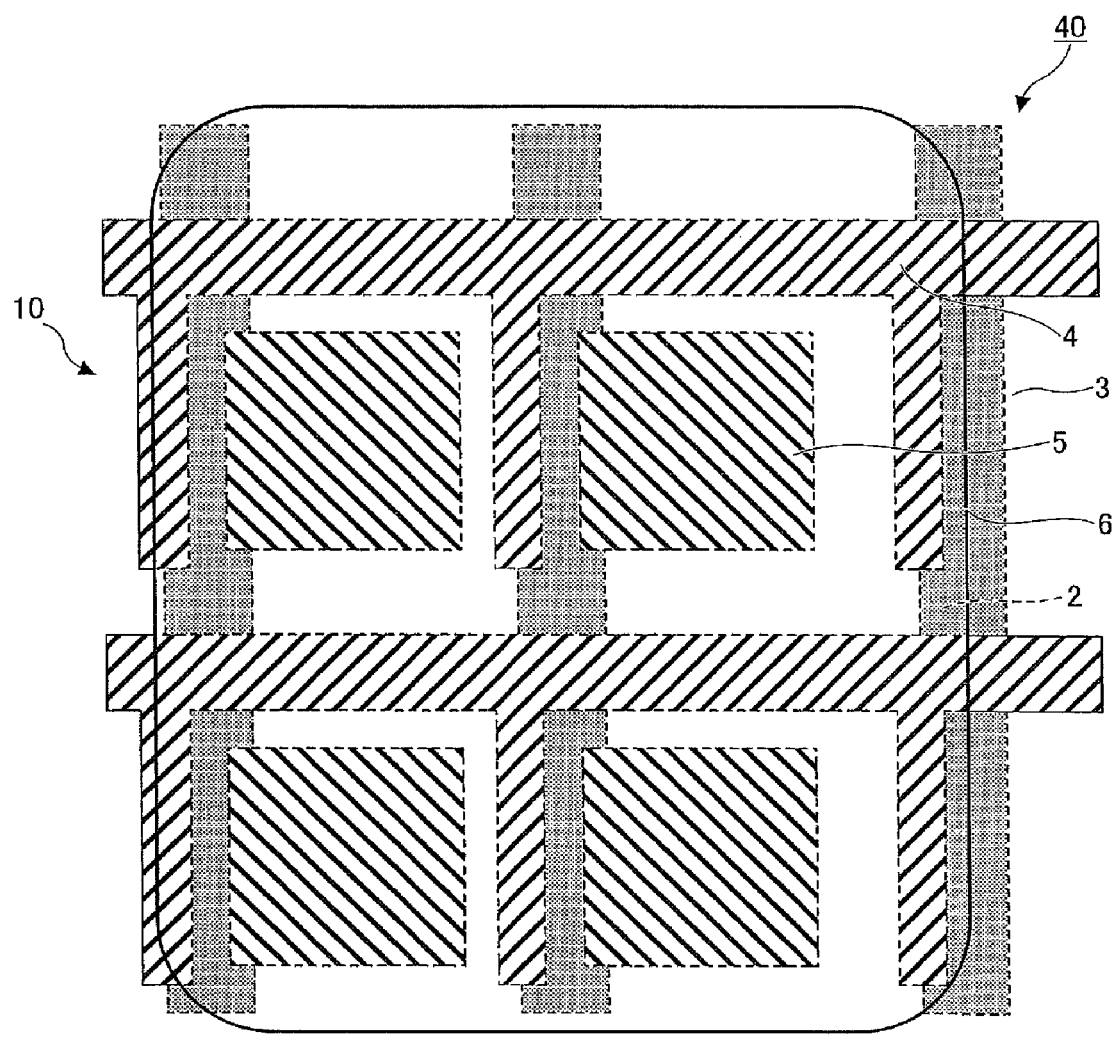
FIG. 4 is a top view of a third example of the organic transistor array according to an embodiment of the present invention.

FIG. 4 illustrates a third example of an organic transistor array according to an embodiment of the present invention. An organic transistor array 40 includes plural organic transistors 10. The organic semiconductor layer 6 is formed over the entire organic transistor array 40. Accordingly, there is no need to form a pattern of the organic semiconductor layer 6, and therefore the organic semiconductor layer 6 can be formed by a spin-coating method. Thus, the organic semiconductor layer 6 can be applied at even higher resolution, and the throughput can be significantly increased. Furthermore, there is no need to adjust the alignment, and therefore the yield can be significantly increased. Ultraviolet rays are radiated from the backside of the substrate (not shown), and ultraviolet light is absorbed in the organic semiconductor layer 6 in a region between the source electrode 4 and the drain electrode 5, at a portion other than the projection region of the gate electrode 2.

Figure 5:
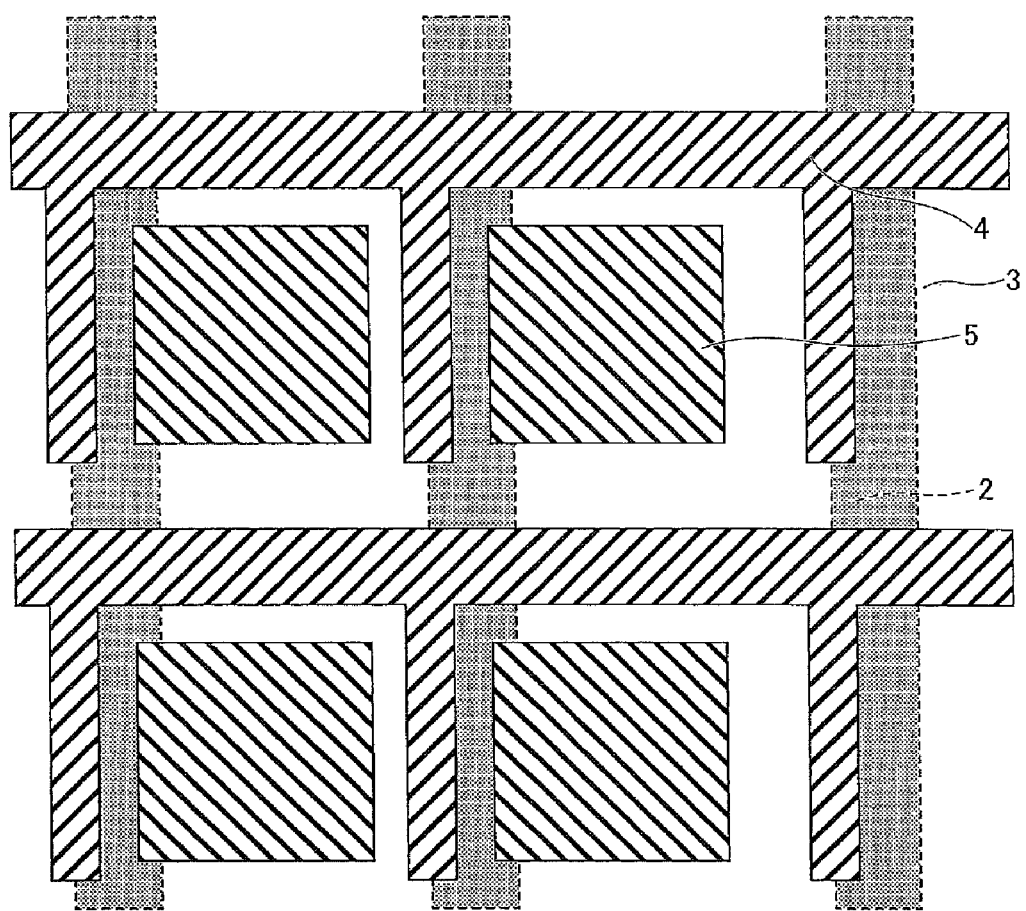
FIG. 5 is a top view of an example of the organic transistor array before forming an organic semiconductor layer.

Next, a description is given on how to form the organic semiconductor layer 6. Before forming the organic semiconductor layer 6, the organic transistor array 20, 30, or 40 appears as illustrated in FIG. 5, with the gate electrodes 2 and the gate insulating films (not shown) sequentially formed in this order, and the source electrodes 4 and the drain electrodes 5 formed on the gate insulating films. On this substrate 1, the organic semiconductor layer 6 is to be formed by a printing method or a spin-coating method. The optimum region for forming the organic semiconductor layer 6 is between the source electrode 4 and the drain electrode 5, in the projection region of the gate electrode 2.

Figure 6:
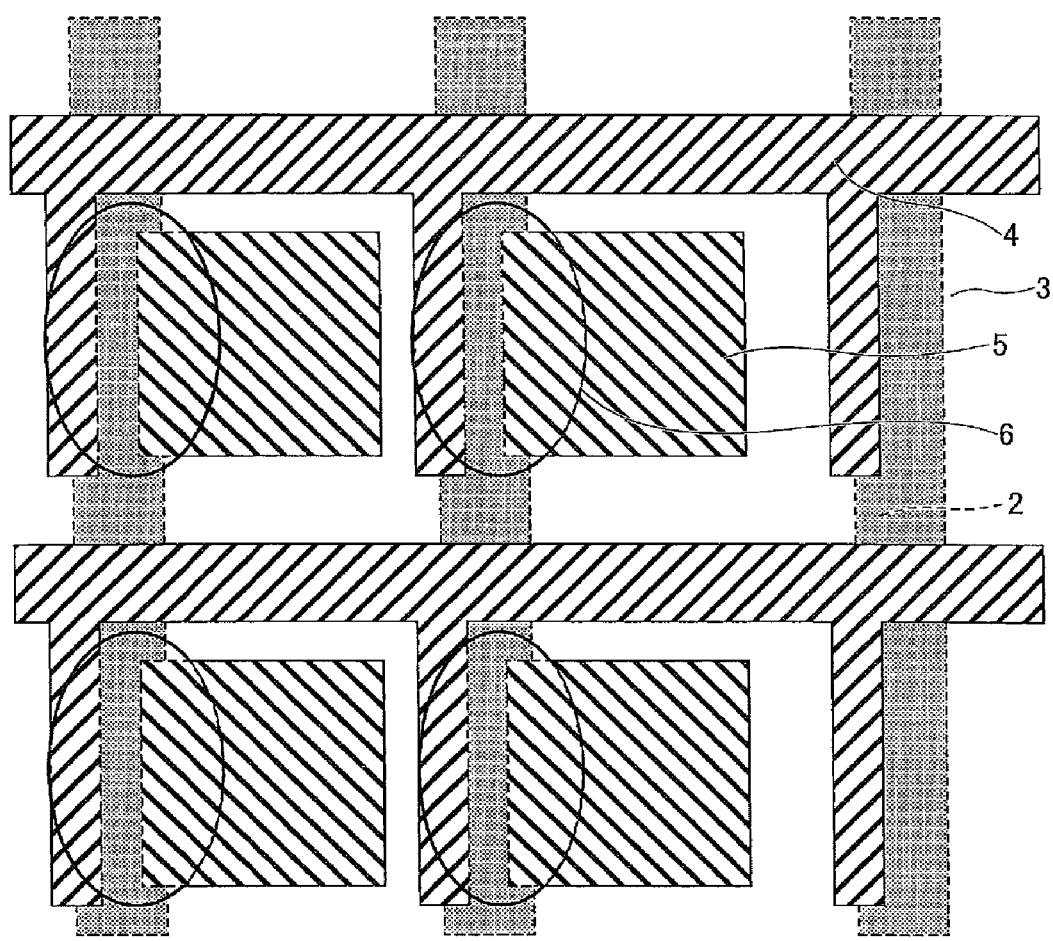
FIG. 6 is a top view of the organic semiconductor layers formed in optimum regions by the inkjet method.

FIG. 6 illustrates the organic semiconductor layers 6 formed in optimum regions by the inkjet method. Each organic semiconductor layer 6 is formed in a region between the corresponding source electrode 4 and the drain electrode 5 in the projection region of the gate electrode 2, but is not formed in the region between the source electrode 4 and the drain electrode 5 outside the projection region of the gate electrode 2.

To drive such an organic transistor array, a selection signal voltage is applied to the gate electrode 2 while applying a certain data signal voltage between the source electrode 4 and the drain electrode 5. Accordingly, it is possible to control the conductivity of the organic semiconductor layer 6 formed in a region between the source electrode 4 and the drain electrode 5 in the projection region of the gate electrode 2. Specifically, when the organic semiconductor layer 6 is a p-type organic semiconductor, a negative selection signal voltage is applied to the gate electrode 2. When the organic semiconductor layer 6 is an n-type semiconductor, a positive selection signal voltage is applied to the gate electrode 2. Accordingly, in either case, carriers are induced and the conductivity of the organic semiconductor layer 6 is increased, thereby turning on the organic transistor array. When the organic semiconductor layer 6 is a p-type organic semiconductor, a positive selection signal voltage is applied to the gate electrode 2. When the organic semiconductor layer 6 is an n-type semiconductor, a negative selection signal voltage is applied to the gate electrode 2. Accordingly, in either case, the carrier density is depleted and the conductivity of the organic semiconductor layer 6 is decreased, thereby turning off the organic transistor array. In this manner, the conductivity of the organic semiconductor layer 6 is controlled, so that the current flowing between the source electrode 4 and the drain electrode 5 is controlled. As described above, the conductivity of the organic semiconductor layer 6 formed in the optimum region can be controlled with a selection signal voltage applied to the gate electrode 2.

However, in practical situations, the recording head of an inkjet device has irregularities to some extent. Consequently, the landing positions of the jetted ink may be displaced. Furthermore, the applied ink may be deflected due to physical properties of the organic semiconductor ink. It is difficult to completely eliminate such irregularities and perfectly control the physical properties of the ink. Moreover, after the inorganic semiconductor ink lands, the inorganic semiconductor ink may spread outside the optimum region. However, the application amount of the organic semiconductor ink can only be decreased to a certain extent. Furthermore, these problems will have a greater impact in producing a transistor that is further miniaturized and even more highly integrated.

Figure 7:
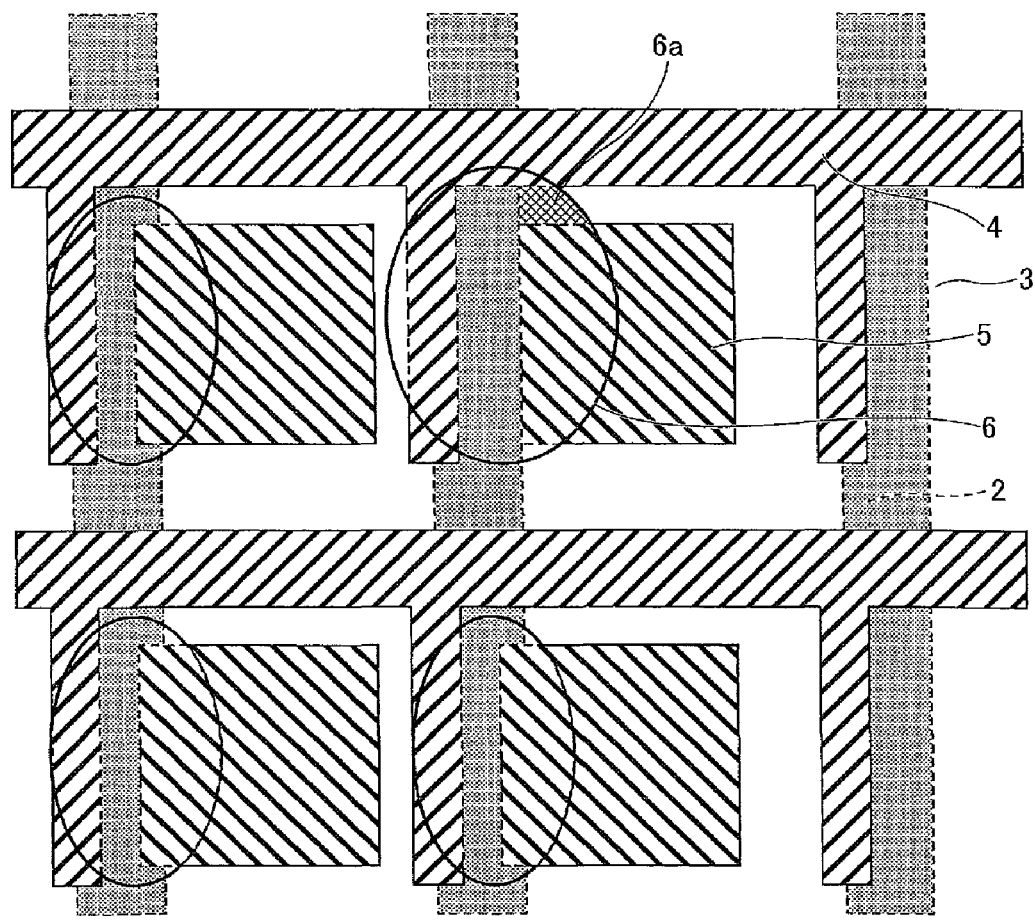
FIG. 7 is a top view of a part of the organic semiconductor layers formed outside the optimum regions by the inkjet method.
Figure 8:
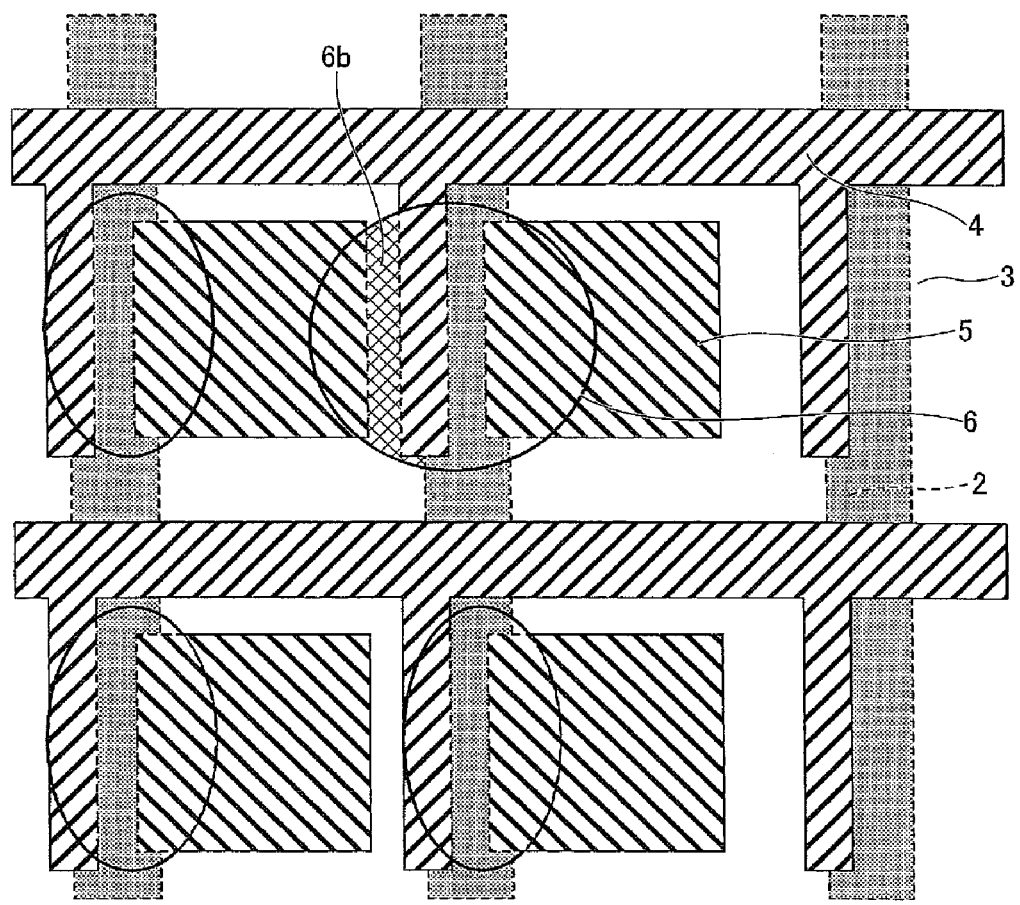
FIG. 8 is a top view of a part of the organic semiconductor layers formed outside the optimum regions by the inkjet method.
Figure 9:
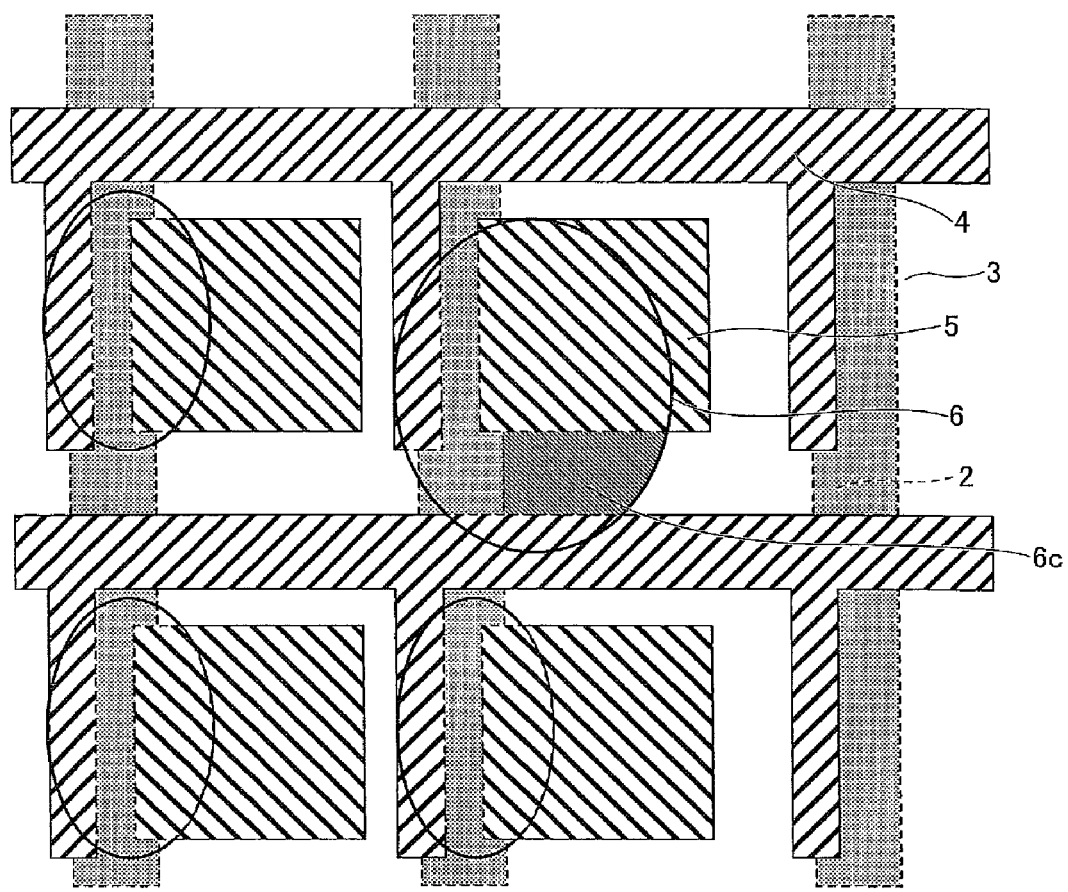
FIG. 9 is a top view of a part of the organic semiconductor layers formed outside the optimum regions by the inkjet method.

FIGS. 7 through 9 illustrate an organic semiconductor layer formed outside the optimum region by the inkjet method. As illustrated in FIGS. 7 through 9, parts of organic semiconductor layers 6a, 6b, and 6c are formed in the region between the source electrode 4 and the drain electrode 5 outside the projection region of the gate electrode 2. The conductivity of the parts of the organic semiconductor layers 6a, 6b, and 6c cannot be controlled by the selection signal voltage applied to the gate electrode 2. Therefore, a certain current based on the conductivity of the organic semiconductor layers 6a, 6b, and 6c constantly flows between the source electrode 4 and the drain electrode 5. As a result, the off current increases, and the on/off ratio of the transistor property decreases. In an active matrix circuit or a display device formed by integrating such transistors, the pixel potential accumulated in an on state decreases due to a leakage current of the off state. Such a problem also arises in cases using methods other than the inkjet method.

Figure 10A:
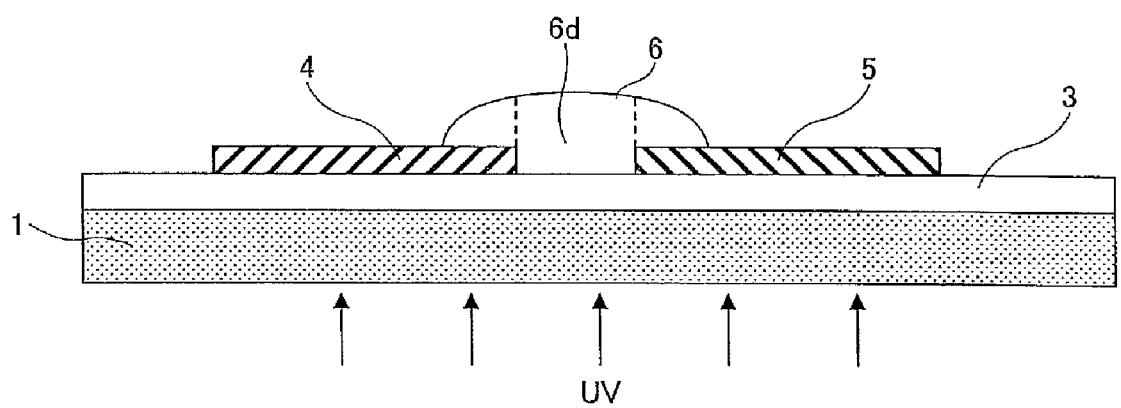
FIGS. 10A and 10B are cross-sectional views of ultraviolet light being radiated from the backside of a substrate.
Figure 10B:
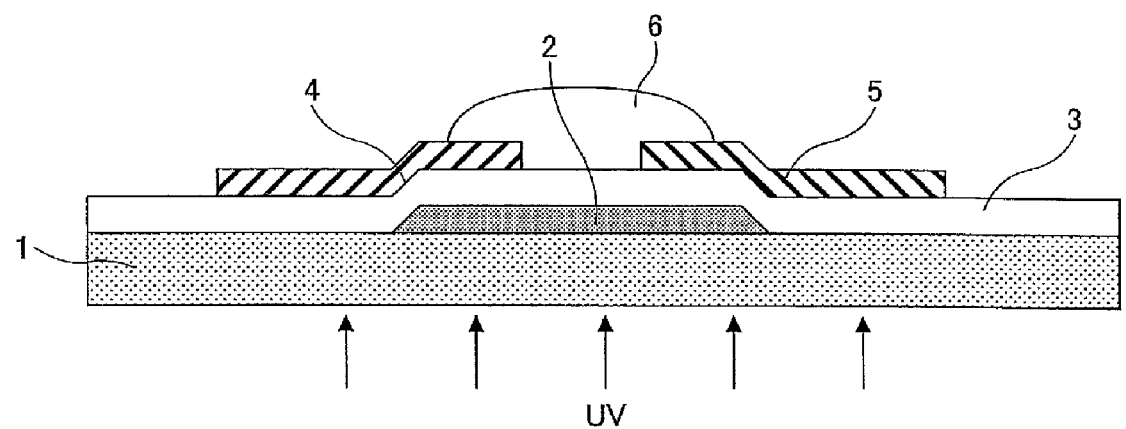

Meanwhile, the conductivity decreases when the organic semiconductor layer 6 absorbs ultraviolet light. Therefore, as shown in FIG. 10A, by radiating the ultraviolet light from the backside of the substrate 1, the conductivity of part of an organic semiconductor layer 6d formed outside the optimum region can be decreased. As a result, the on/off ratio of the transistor property can be increased. In this case, the gate electrode 2 reflects the ultraviolet light (see FIG. 10B), and therefore the conductivity of the organic semiconductor layer 6 formed in the optimum region does not decrease.

Figure 11:
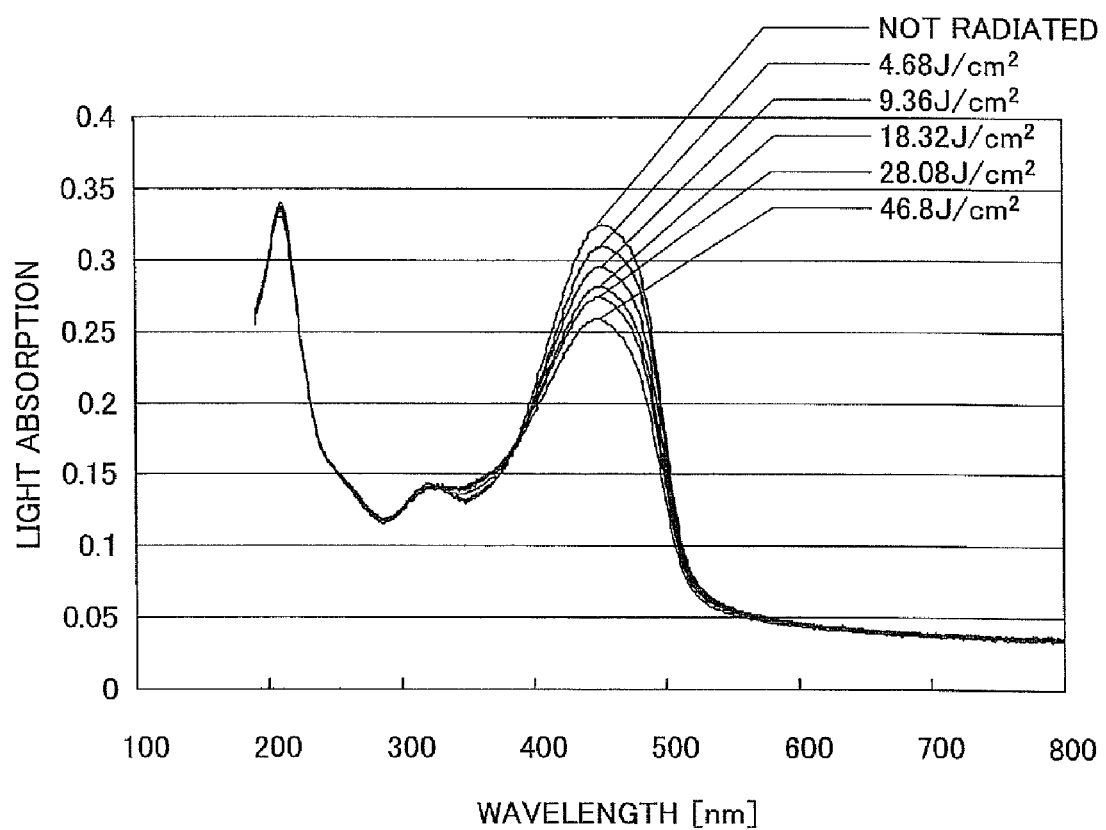
FIG. 11 illustrates changes in the light absorption spectrum of the organic semiconductor layer with respect to the radiation amount of ultraviolet light having a wavelength of 365 nm.

Next, a description is given of changes in the physical properties of the organic semiconductor layer 6 caused by absorbing ultraviolet light. FIG. 11 illustrates changes in the absorption spectrum of light having a wavelength of 180 nm through 800 nm in the organic semiconductor layer 6, with respect to the radiation amount of ultraviolet light having a wavelength of 365 nm. The light absorption spectrum was measured with an organic semiconductor film formed on a silica glass substrate by the spin-coating method with the use of the material expressed by the chemical formula (A). As shown in FIG. 11, the absorption peak on the long-wavelength side decreases as the radiation amount of the ultraviolet light increases. This means that the conductivity of the organic semiconductor film is mitigated by absorbing the ultraviolet light.

Figure 12:
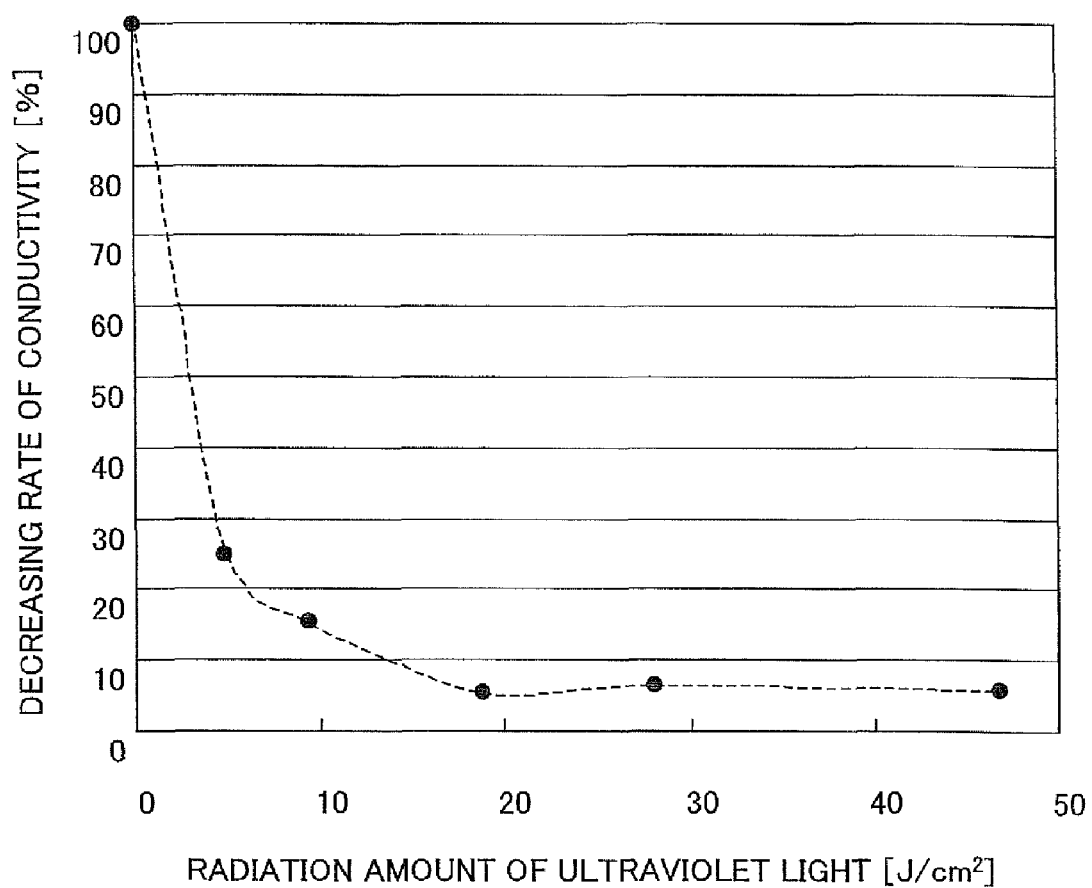
FIG. 12 illustrates changes in the conductivity of the organic semiconductor layer with respect to the radiation amount of ultraviolet light having a wavelength of 365 nm.

FIG. 12 illustrates the change in the conductivity of the organic semiconductor film with respect to the radiation amount of the ultraviolet light having a wavelength of 365 nm. The conductivity of the organic semiconductor film was evaluated by measuring the current when a certain voltage was applied to the organic semiconductor film formed with respect to a channel having a certain counter electrode width and inter-electrode distance. As shown in FIG. 12, the conductivity of the organic semiconductor film decreases until the radiation amount of the ultraviolet light reaches 18.7 $J/cm^2$. When the radiation amount of the ultraviolet light is 18.7 $J/cm^2$, the conductivity of the organic semiconductor film decreases to less than or equal to 10%. However, the decreasing rate of the conductivity of the organic semiconductor film will not decline any further even by increasing the radiation amount of the ultraviolet light beyond 18.7 $J/cm^2$. These results say that the conductivity of the organic semiconductor film can be effectively mitigated by radiating ultraviolet light.

Furthermore, an active matrix display device can be achieved by using an active matrix substrate including the organic transistor array according to an embodiment of the present invention in combination with pixel display elements such as electrophoresis elements, liquid crystal elements, and organic EL elements, as the active matrix elements.

For example, a transparent conductive film is formed on an opposed substrate by a sputtering method with ITO (Indium Tin Oxide) having a thickness of approximately 100 nm. Next, polyamide acid is applied on the transparent conductive film by a spin-coating method, and is rubbed so that an oriented film having a thickness of approximately 200 nm is formed. Subsequently, an orientation process is performed. Then, the opposed substrate with the oriented film formed thereon and the active matrix substrate are joined via a silica spacer, and a liquid crystal material is supplied into the gap, thereby obtaining a liquid crystal panel.

Furthermore, an electrophoresis display panel can be obtained by joining the opposed substrate with a transparent conductive film formed thereon and the active matrix substrate via a silica spacer, and filling the gap with microcapsules.

Furthermore, an organic EL panel is obtained by forming organic EL elements on the active matrix substrate, and arranging an atmosphere blocking shield.

With such an active matrix display device, it is possible to reduce the leakage current caused by imperfect patterns of the organic semiconductor layer on the active matrix substrate, and to reduce the off current while the transistor is being operated. Therefore, crosstalk between pixels can be mitigated. Furthermore, because the off current is reduced, the power consumption can also be reduced.

EXAMPLES

Practical Example 1

By performing a vacuum deposition method using a shadow mask, an adherence layer (not shown) made of Cr having a film thickness of 3 nm and the gate electrode 2 made of Al having a film thickness of 100 nm were formed on the glass substrate 1. Next, by performing a CVD method, the gate insulating film 3 made of polyparaxylylene having a film thickness of 500 nm obtained from a di-monochloro-paraxylen solid dimer was formed on the gate electrode 2. Furthermore, by performing a vacuum deposition method using a shadow mask, patterns of the source electrode 4 and the drain electrode 5 made of Au having film thicknesses of 50 nm were formed on the gate insulating film 3. The channel width was 140 μm and the channel length was 10 μm. Next, the inkjet method was performed to print the organic semiconductor layer 6 in an island-like shape with the use of a solution made of a material expressed by the chemical formula (A), on the gate insulating film 3 having the source electrode 4 and the drain electrode 5 formed thereon. Furthermore, ultraviolet light having a wavelength of 365 nm was radiated from the backside of the glass substrate 1 at an amount of 18.72 $J/cm^2$, thereby forming the organic transistor array 20.

In an atmosphere where oxygen<1 ppm and moisture<1 ppm, a drain voltage $V_{ds}$ of −20 V was applied, and a gate voltage $V_g$ was scanned from +20 V to −20 V, and the on current and the off current were measured. It was found that the on current $I_{ds}$ was $-4.23 \times 10^{-8}$ A ($V_g$=−20 V), the off current $I_{ds}$ was $-1.73 \times 10^{-11}$ A ($V_g$+20V), and the on/off ratio ($V_g$=−20 V/$V_g$=+20 V) was $2.45 \times 10^3$. Each of the on current and the off current corresponds to an average value of 20 portions.

Comparative Example 1

Ultraviolet light having a wavelength of 365 nm was not radiated from the backside of the glass substrate 1. Otherwise, an organic transistor array was obtained in the same manner as that of practical example 1.

Next, the on current and the off current were measured in the same manner as that of practical example 1. The on current $I_{ds}$ was $-4.15 \times 10^{-8}$ A ($V_g$=−20 V), the off current $I_{ds}$ was $-1.20 \times 10^{-10}$ A ($V_g$=+20V), and the on/off ratio ($V_g$=−20 V/$V_g$=+20 V) was $3.45 \times 10^2$.

These results say that the off current of the organic transistor array of practical example 1 becomes lower than that of comparative example 1, and therefore the on/off ratio is higher in practical example 1, so that good transistor properties can be attained with the organic transistor array of practical example 1.

Practical Example 2

The organic semiconductor layers 6 were formed as stripes on the gate insulating film 3 with the source electrode 4 and the drain electrode 5 formed thereon. Otherwise, the organic transistor array 30 was obtained in the same manner as that of practical example 1.

Next, the on current and the off current were measured in the same manner as that of practical example 1. The on current $I_{ds}$ was $-4.66 \times 10^{-8}$ A (Vg=−20V), the off current $I_{ds}$ was $-3.81 \times 10^{-11}$ A ($V_g$=+20V), and the on/off ratio ($V_g$=−20 V/$V_g$=+20 V) was $1.22 \times 10^3$.

Comparative Example 2

Ultraviolet light having a wavelength of 365 nm was not radiated from the backside of the glass substrate 1. Otherwise, an organic transistor array was obtained in the same manner as that of practical example 2.

Next, the on current and the off current were measured in the same manner as that of practical example 1. The on current $I_{ds}$ was $-4.75 \times 10^{-8}$ A ($V_g$=−20 V), the off current $I_{ds}$ was $-6.56 \times 10^{-10}$ A ($V_g$=+20V), and the on/off ratio ($V_g$=−20 V/$V_g$=+20 V) was $7.24 \times 10$.

These results say that the off current of the organic transistor array of practical example 2 becomes lower than that of comparative example 2, and therefore the on/off ratio is higher in practical example 2, so that good transistor properties can be attained with the organic transistor array of practical example 2.

Practical Example 3

The organic semiconductor layer 6 was formed, by a spin-coating method, over the entire the gate insulating film 3 with the source electrode 4 and the drain electrode 5 formed thereon. Otherwise, the organic transistor array 40 was obtained in the same manner as that of practical example 1.

Next, the on current and the off current were measured in the same manner as that of practical example 1. The on current $I_{ds}$ was $-3.76 \times 10^{-8}$ A ($V_g = -20$ V), the off current $I_{ds}$ was $-4.55 \times 10^{-10}$ A ($V_g = +20$ V), and the on/off ratio ($V_g = -20$ V/$V_g = +20$ V) was $8.26 \times 10$.

Comparative Example 3

Ultraviolet light having a wavelength of 365 nm was not radiated from the backside of the glass substrate 1. Otherwise, an organic transistor array was obtained in the same manner as that of practical example 3.

Next, the on current and the off current were measured in the same manner as that of practical example 1. The on current $I_{ds}$ was $-3.88 \times 10^{-8}$ A ($V_g = -20$ V), the off current $I_{ds}$ was $-7.83 \times 10^{-9}$ A ($V_g = +20$ V), and the on/off ratio ($V_g = -20$ V/$V_g = +20$ V) was 4.95.

These results say that the off current of the organic transistor array of practical example 3 becomes lower than that of comparative example 3, and therefore the on/off ratio is higher in practical example 3, so that good transistor properties can be attained with the organic transistor array of practical example 3.

Practical Example 4

Figure 13:
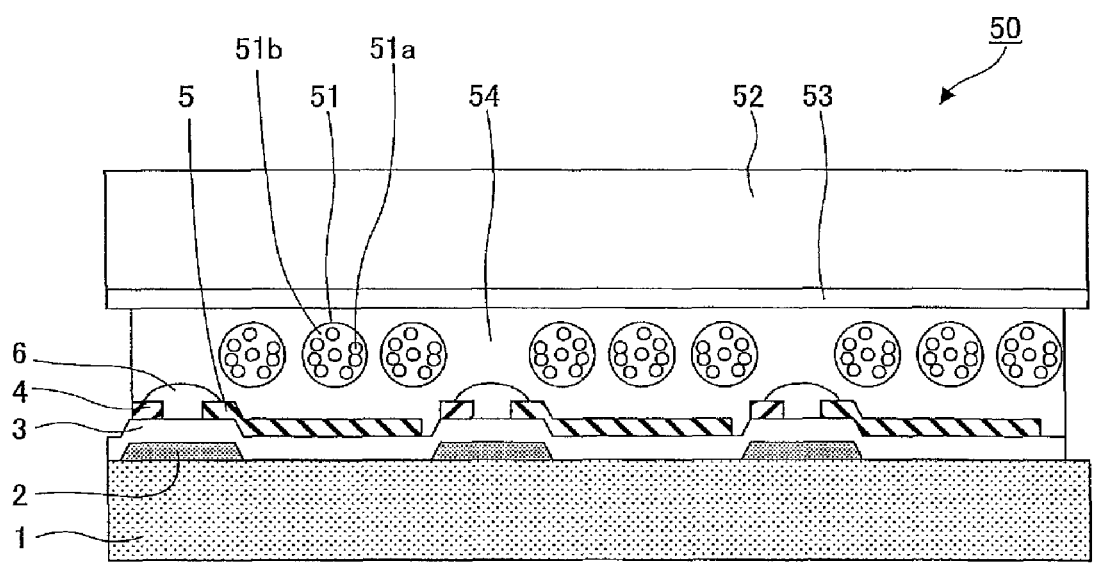
FIG. 13 is a cross-sectional view of an active matrix display device of practical example 4.

The organic transistor array of practical example 1 was used to fabricate an active matrix display device 50 (see FIG. 13). Specifically, a coating liquid was obtained by mixing together microcapsules 51 encapsulating titanium oxide particles 51a and Isoper 51b colored with oil blue, with a polyvinyl alcohol solution. This coating liquid was applied on a transparent electrode 53 including ITO provided on a polycarbonate substrate 52, thereby forming a layer including the microcapsules 51 and a binder 54. The resultant substrate was joined with the organic transistor array of practical example 1 via the binder 54, in such a manner that the glass substrate 1 and the polycarbonate substrate 52 are the outermost sides.

The resultant active matrix display device 50 was operated, and images having high contrast were displayed.

According to an aspect of the present invention, there is provided an organic transistor including a substrate; a gate electrode and a gate insulating film sequentially formed on the substrate in the stated order; and a source electrode, a drain electrode, and an organic semiconductor layer formed on at least the gate insulating film, wherein ultraviolet light is radiated to the substrate from a side without the gate electrode, transmitted through the substrate and the gate insulating film, reflected at the gate electrode, and absorbed at the organic semiconductor layer; and conductivity of the organic semiconductor layer that has absorbed the ultraviolet light is lower than that of the organic semiconductor layer that has not absorbed the ultraviolet light.

Additionally, according to an aspect of the present invention, in the organic transistor, the organic semiconductor layer that has absorbed the ultraviolet light is decomposed.

Additionally, according to an aspect of the present invention, in the organic transistor, a radiation amount of the ultraviolet light is more than or equal to 18.7 J/cm$^2$; and the conductivity of the organic semiconductor layer that has absorbed the ultraviolet light is less than or equal to 10% of that of the organic semiconductor layer that has not absorbed the ultraviolet light.

Additionally, according to an aspect of the present invention, in the organic transistor, the ultraviolet light is not absorbed at the substrate or the gate insulating film.

Additionally, according to an aspect of the present invention, in the organic transistor, the ultraviolet light is not absorbed at the gate electrode.

Additionally, according to an aspect of the present invention, in the organic transistor, the organic semiconductor layer is formed over the entire organic transistor.

Additionally, according to an aspect of the present invention, in the organic transistor, the organic semiconductor layer includes an organic semiconductor material that is soluble in an organic solvent.

Additionally, according to an aspect of the present invention, in the organic transistor, the organic semiconductor material includes a high polymer material comprising a triarylamine skeleton.

Additionally, according to an aspect of the present invention, in the organic transistor, at least one of the source electrode and the drain electrode pair and the gate electrode is formed by a printing method.

Additionally, according to an aspect of the present invention, in the organic transistor, at least one of the source electrode and the drain electrode pair and the gate electrode is formed with the use of ink comprising metal particles or a metal complex.

Additionally, according to an aspect of the present invention, in the organic transistor, the metal particles comprise Au, Ag, Cu, or Ni.

Additionally, according to an aspect of the present invention, there is provided an organic transistor array including plural of the above organic transistors.

Additionally, according to an aspect of the present invention, in the organic transistor array, the organic semiconductor layer is formed in an island-like shape.

Additionally, according to an aspect of the present invention, in the organic transistor array, the organic semiconductor layer is formed in a stripe-like shape.

Additionally, according to an aspect of the present invention, there is provided a display device including the above organic transistor array.

The present invention is not limited to the specifically disclosed embodiment, and variations and expansions may be made without departing from the scope of the present invention.

The present application is based on Japanese Priority Patent Application No. 2007-280699, filed on Oct. 29, 2007, the entire contents of which are hereby incorporated by reference.

The invention claimed is:

1. An organic transistor comprising: a substrate; a gate electrode and a gate insulating film sequentially formed on the substrate in the stated order; and a source electrode, a drain electrode, and an organic semiconductor layer formed on at least the gate insulating film, wherein: ultraviolet light is radiated to the substrate from a side without the gate electrode, transmitted through the substrate and the gate insulating film, reflected at the gate electrode, and absorbed at the organic semiconductor layer; and conductivity of the organic semiconductor layer that has absorbed the ultraviolet light is lower than that of the organic semiconductor layer that has not absorbed the ultraviolet light, wherein: the organic semiconductor layer that has absorbed the ultraviolet light is decomposed, and a radiation amount of the ultraviolet light is more than or equal to 18.7 $J/cm^2$; and the conductivity of the organic semiconductor layer that has absorbed the ultraviolet light is less than or equal to 10% of that of the organic semiconductor layer that has not absorbed the ultraviolet light.

2. The organic transistor according to claim 1, wherein: the ultraviolet light is not absorbed at the substrate or the gate insulating film.

3. The organic transistor according to claim 1, wherein: the ultraviolet light is not absorbed at the gate electrode.

4. The organic transistor according to claim 1, wherein: the organic semiconductor layer is formed over the entire organic transistor.

5. The organic transistor according to claim 1, wherein: the organic semiconductor layer comprises an organic semiconductor material that is soluble in an organic solvent.

6. The organic transistor according to claim 5, wherein: the organic semiconductor material comprises a high polymer material comprising a triarylamine skeleton.

7. The organic transistor according to claim 1, wherein: at least one of the source electrode and the drain electrode pair and the gate electrode is formed by a printing method.

8. The organic transistor according to claim 7, wherein: at least one of the source electrode and the drain electrode pair and the gate electrode is formed with the use of ink comprising metal particles or a metal complex.

9. The organic transistor according to claim 8, wherein: the metal particles comprise Au, Ag, Cu, or Ni.

10. An organic transistor array comprising plural organic transistors, each organic transistor of the plural organic transistors comprising: a substrate; a gate electrode and a gate insulating film sequentially formed on the substrate in the stated order; and a source electrode, a drain electrode, and an organic semiconductor layer formed on at least the gate insulating film, wherein: ultraviolet light is radiated to the substrate from a side without the gate electrode, transmitted through the substrate and the gate insulating film, reflected at the gate electrode, and absorbed at the organic semiconductor layer; and conductivity of the organic semiconductor layer that has absorbed the ultraviolet light is lower than that of the organic semiconductor layer that has not absorbed the ultraviolet light, wherein: the organic semiconductor layer that has absorbed the ultraviolet light is decomposed, and a radiation amount of the ultraviolet light is more than or equal to 18.7 $J/cm^2$; and the conductivity of the organic semiconductor layer that has absorbed the ultraviolet light is less than or equal to 10% of that of the organic semiconductor layer that has not absorbed the ultraviolet light.

11. The organic transistor array according to claim 10, wherein the organic semiconductor layer is formed in an island-like shape.

12. The organic transistor array according to claim 10, wherein the organic semiconductor layer is formed in a stripe-like shape.

13. A display device comprising an organic transistor array comprising plural organic transistors, each organic transistor of the plural organic transistors comprising: a substrate; a gate electrode and a gate insulating film sequentially formed on the substrate in the stated order; and a source electrode, a drain electrode, and an organic semiconductor layer formed on at least the gate insulating film, wherein: ultraviolet light is radiated to the substrate from a side without the gate electrode, transmitted through the substrate and the gate insulating film, reflected at the gate electrode, and absorbed at the organic semiconductor layer; and conductivity of the organic semiconductor layer that has absorbed the ultraviolet light is lower than that of the organic semiconductor layer that has not absorbed the ultraviolet light, wherein: the organic semiconductor layer that has absorbed the ultraviolet light is decomposed, and a radiation amount of the ultraviolet light is more than or equal to 18.7 $J/cm^2$; and the conductivity of the organic semiconductor layer that has absorbed the ultraviolet light is less than or equal to 10% of that of the organic semiconductor layer that has not absorbed the ultraviolet light.

* * * * *